(12) United States Patent
Dono

(10) Patent No.: US 11,156,658 B2
(45) Date of Patent: Oct. 26, 2021

(54) SEMICONDUCTOR MEMORY DEVICE

(71) Applicant: Micron Technology, Inc., Boise, ID (US)

(72) Inventor: Chiaki Dono, Chuo-ku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/447,409

(22) Filed: Jun. 20, 2019

(65) Prior Publication Data

US 2019/0302181 A1 Oct. 3, 2019

Related U.S. Application Data

(62) Division of application No. 15/683,430, filed on Aug. 22, 2017, now Pat. No. 10,365,325.

(51) Int. Cl.
| | |
|---|---|
| *G01R 31/317* | (2006.01) |
| *G11C 29/38* | (2006.01) |
| *G11C 29/36* | (2006.01) |
| *G11C 29/02* | (2006.01) |
| *G11C 29/12* | (2006.01) |
| *G11C 29/48* | (2006.01) |

(Continued)

(52) U.S. Cl.
CPC ...... *G01R 31/31716* (2013.01); *G11C 29/022* (2013.01); *G11C 29/1201* (2013.01); *G11C 29/36* (2013.01); *G11C 29/38* (2013.01); *G11C 29/48* (2013.01); *G11C 2029/0401* (2013.01); *G11C 2029/5602* (2013.01)

(58) Field of Classification Search
CPC .................. G01R 31/31716; G11C 29/38
See application file for complete search history.

(56) References Cited

U.S. PATENT DOCUMENTS

| | | | |
|---|---|---|---|
| 5,224,149 A | 6/1993 | Garcia | |
| 5,425,075 A | 6/1995 | Selden et al. | |

(Continued)

FOREIGN PATENT DOCUMENTS

| | | |
|---|---|---|
| CN | 111149162 | 5/2020 |
| KR | 20160090950 A | 8/2016 |

(Continued)

OTHER PUBLICATIONS

"International Application Serial No. PCT US2018 045024, International Preliminary Report on Patentability dated Mar. 5, 2020", 12 pgs.

(Continued)

*Primary Examiner* — Joseph D Torres
(74) *Attorney, Agent, or Firm* — Schwegman Lundberg & Woessner, P.A.

(57) ABSTRACT

Techniques for memory I/O tests using integrated test data paths are provided. In an example, a method for operating input/output data paths of a memory apparatus can include receiving, during a first mode, non-test information at a data terminal of a first channel of the memory apparatus from a memory array of the first channel via a first data path, receiving during a first test mode, first test information at the data terminal of the first channel from a first additional data path coupling the first channel with a second channel of the memory apparatus, and wherein an interface die of the memory apparatus includes the first data path and the additional data path.

8 Claims, 9 Drawing Sheets

(51) Int. Cl.
*G11C 29/04* (2006.01)
*G11C 29/56* (2006.01)

(56) References Cited

U.S. PATENT DOCUMENTS

| | | | |
|---|---|---|---|
| 5,471,603 A * | 11/1995 | Yokote | G11C 5/02 |
| | | | 711/105 |
| 6,807,646 B1 | 10/2004 | Williams et al. | |
| 7,165,196 B1 | 1/2007 | Porat et al. | |
| 9,689,918 B1 | 6/2017 | Cheng et al. | |
| 10,365,325 B2 | 7/2019 | Dono | |
| 2004/0184409 A1 | 9/2004 | Schoenborn et al. | |
| 2005/0015213 A1 | 1/2005 | Somervill et al. | |
| 2005/0035753 A1* | 2/2005 | Abdennadher | G01R 31/31723 |
| | | | 324/762.01 |
| 2005/0047495 A1 | 3/2005 | Yoshioka | |
| 2005/0066244 A1* | 3/2005 | Jas | G06F 11/263 |
| | | | 714/732 |
| 2005/0138501 A1* | 6/2005 | Motika | G01R 31/318566 |
| | | | 714/724 |
| 2006/0146741 A1 | 7/2006 | Muraoka | |
| 2007/0079198 A1 | 4/2007 | Komura | |
| 2007/0164728 A1 | 7/2007 | Muljono | |
| 2008/0086667 A1 | 4/2008 | Chen et al. | |
| 2008/0215938 A1 | 9/2008 | Lee | |
| 2009/0031077 A1* | 1/2009 | Klein | G06F 13/4239 |
| | | | 711/105 |
| 2009/0316495 A1 | 12/2009 | Inaba et al. | |
| 2011/0026411 A1 | 2/2011 | Hao | |
| 2011/0167319 A1* | 7/2011 | Jeddeloh | G06F 11/108 |
| | | | 714/763 |
| 2012/0069621 A1 | 3/2012 | Norman | |
| 2012/0269005 A1 | 10/2012 | Yoon | |
| 2014/0089752 A1 | 3/2014 | Nelson et al. | |
| 2016/0216319 A1 | 7/2016 | Na et al. | |
| 2018/0062970 A1* | 3/2018 | Abzakh | G06F 11/3006 |
| 2019/0066816 A1 | 2/2019 | Dono | |

FOREIGN PATENT DOCUMENTS

| | | |
|---|---|---|
| TW | 201920977 A | 6/2019 |
| WO | WO-2019040256 A1 | 2/2019 |

OTHER PUBLICATIONS

"International Application Serial No. PCT/US2018/045024, International Search Report dated Nov. 27, 2018", 3 pgs.

"International Application Serial No. PCT/US2018/045024, Written Opinion dated Nov. 27, 2018", 10 pgs.

"Taiwanese Application Serial No. 107127534, First Office Action dated May 13, 2019", 13 pgs.

"Taiwanese Application Serial No. 107127534, Response filed Nov. 14, 2019 to First Office Action dated May 13, 2019", w English Claims, 31 pgs.

U.S. Appl. No. 15/683,430, filed Aug. 22, 2017, Semiconductor Memory Device.

"European Application Serial No. 18848845.6, Extended European Search Report dated Apr. 19, 2021", 9 pgs.

"European Application Serial No. 18848845.6, Response filed Oct. 9, 2020 to Communication pursuant to Rule 161(1) and 162 EPC dated Apr. 1, 2020", 15 pgs.

"Korean Application Serial No. 10-2020-7007372, Notice of Preliminary Rejection dated Dec. 14, 2020", w/ English translation, 18 pgs.

"Korean Application Serial No. 10-2020-700/372, Response filed Jan. 21, 2021 to Notice of Preliminary Rejection dated Dec. 14, 2020", w/ English Claims, 16 pgs.

"Korean Application Serial No. 10-2020-7007372, Final Office Action dated Jun. 14, 2021", w English translation, 8 pgs.

* cited by examiner

SEMICONDUCTOR MEMORY DEVICE

PRIORITY APPLICATION

This application is a divisional of U.S. application Ser. No. 15/683,430, filed Aug. 22, 2017, which is incorporated herein by reference in its entirety.

BACKGROUND

A loop-back test has been used to evaluate operation of input and output (I/O) terminal operation of large scale integrated (LSI) circuits. Executing a loop-back test for memory in some forms is difficult, however. For example, such testing is difficult for memory in non-component form applied to devices combined into a system-in-package (SIP), a memory having a large number of I/Os, or a high speed memory, as it is difficult to configure on an externa, test equipment or an external test board. When the memory is configured for SIP, a number of memory I/Os cannot be subjected to direct testing via external test equipment because of accessibility and because the large number and the density of the external I/O connections. To provide test equipment that could configure a loop-back test would require undesirable enlargement of the SIP system and significant cost. Such enlargement would result from providing reliable physical connectivity to the I/O terminals or from accommodating additional terminals or special circuitry for generating and gathering test data of the I/O circuits under test.

For multiple memory systems such as high bandwidth memory (HBM), where naked DRAMs are stacked and mounted with a memory controller together on a substrate, such as a silicon (Si) interposer, it is difficult and resource expensive to reliably configure and carry out a probe test of, for example, an 8-channel, stacked memory subsystem, when the test interface to the I/Os can include 1280 or more micro-bumps (μ-bumps) of 25 μm diameter.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
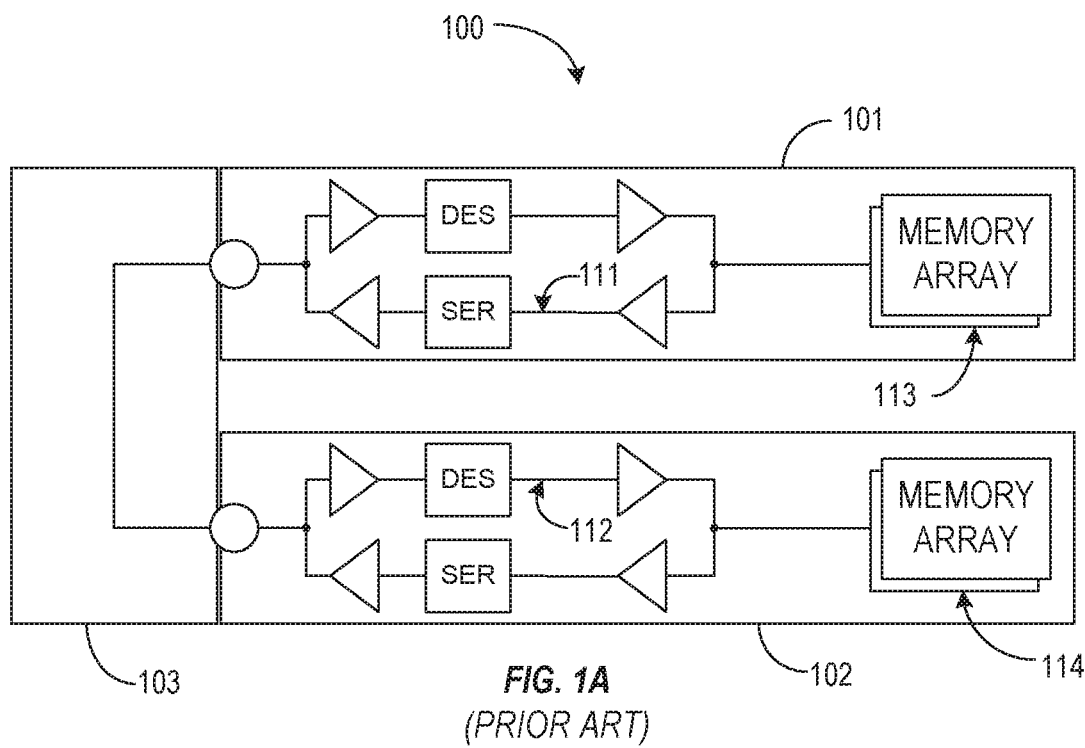
FIGS. 1A and 1B illustrates generally conventional external loop-back test systems.

The present disclosure addresses apparatus and methods for providing loop-back testing of I/O circuits of an integrated circuit package that can avoid enlargement of the integrated circuits, and/or costly adapters to connect the I/O to external test equipment. FIG. 1A illustrates generally conventional external loop-back test system 100. In an example, the test system 100 can include a first memory circuit 101 including a first I/O circuit 111, a second memory circuit 102 including a second I/O circuit 112, and an external test board 103. The first loopback test can be conducted, for example, by providing data from a memory array 113 in the first memory circuit 101, transmitting the data using the I/O circuit 111 of the first memory circuit 101 to the external test board 103, receiving the data from the test board 103 at the I/O circuit 112 of the second memory circuit 102, saving the data using a memory array 114 of the second memory circuit 102 and comparing the generated data with the saved data to evaluate the operation of the respective I/O circuits 111, 112. A second loopback test can generate and pass the test data from the second memory circuit 102 to the first memory circuit 101. The conventional loop hack test relies on the functionality of both memory circuits 101, 102.

Figure 1B:
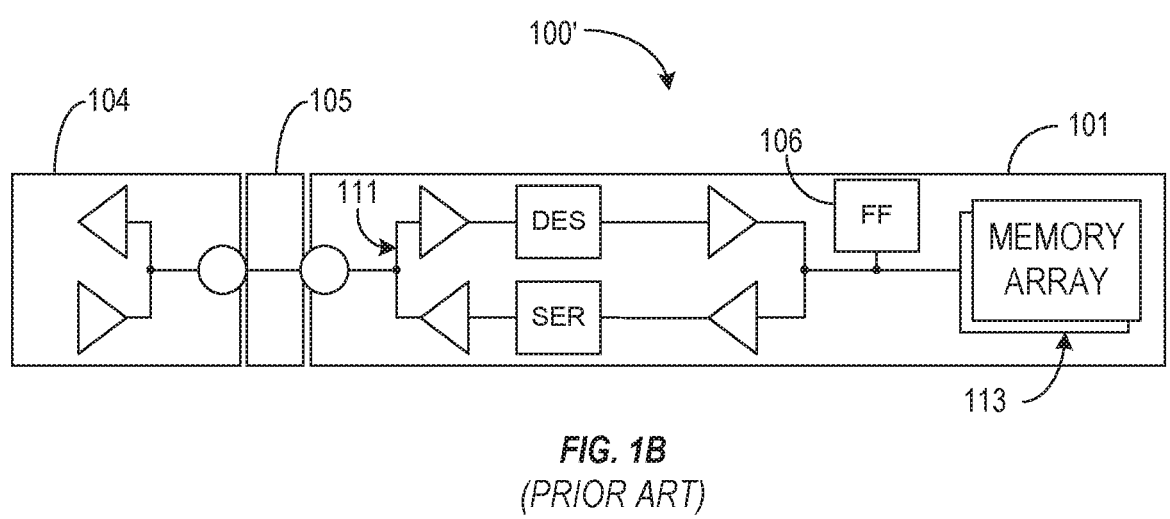

FIG. 1B illustrates another conventional external loop-back test system 100' that can perform the loopback test with the memory circuit 101 mounted to a motherboard 105. In such a set-up, a memory controller 104, also mounted to the motherboard 105, can generate test data and transmit the test data to the memory circuit 101 using for example the write path of an I/O circuit 111 of the memory circuit 101. The test data can be stored in a special register 106 of the memory circuit 106. The test data can be transmitted back to the memory controller 104 using, for example, a read path of the I/O circuit 111. The generated test data can then be compared to the test data received from the memory 10 circuit 111 to evaluate the operation of the memory I/O circuit 111. In certain examples, a loop-back test system 100 can use a special register 106 to store the test data so that operation of the memory arrays 113 do not influence the test of the I/O circuit 111.

Figure 2A:
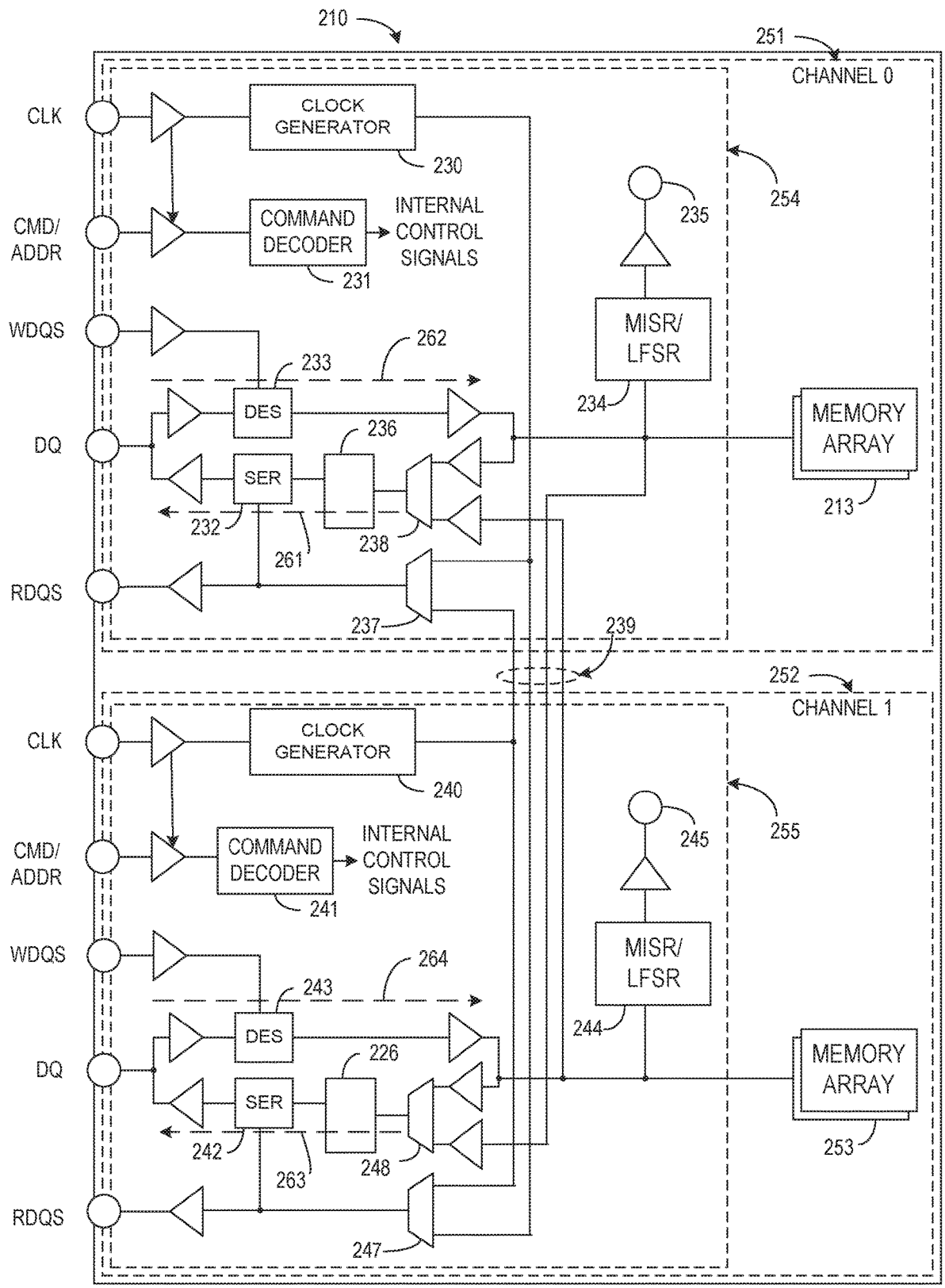
FIGS. 2A-2C illustrate generally example I/O logic circuits for two channels of a single-semiconductor, multi-channel memory device that allows execution of loop-hack testing of the I/O logic circuit of each channel without requiring off-chip data paths.
Figure 2B:
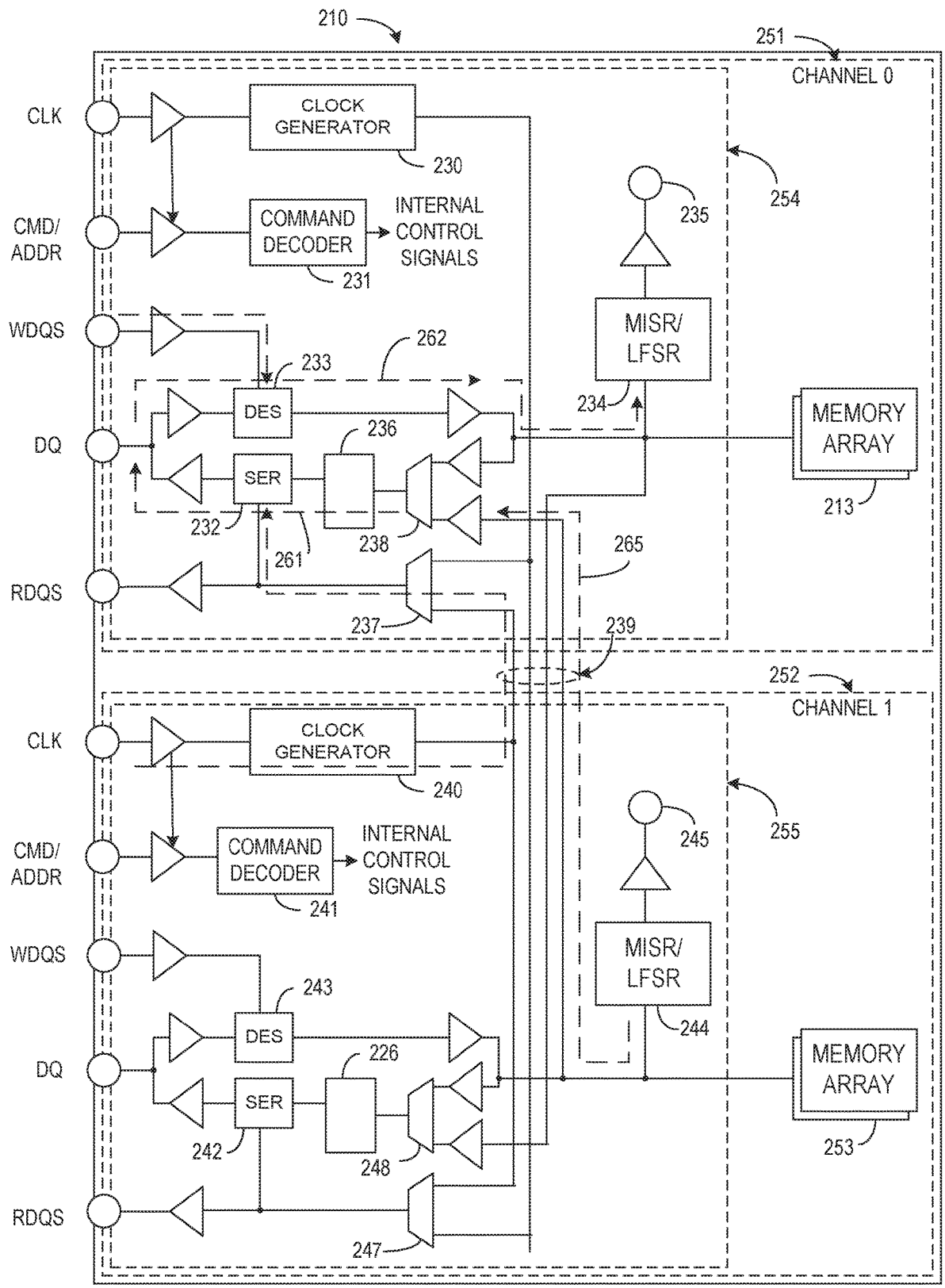
Figure 2C:
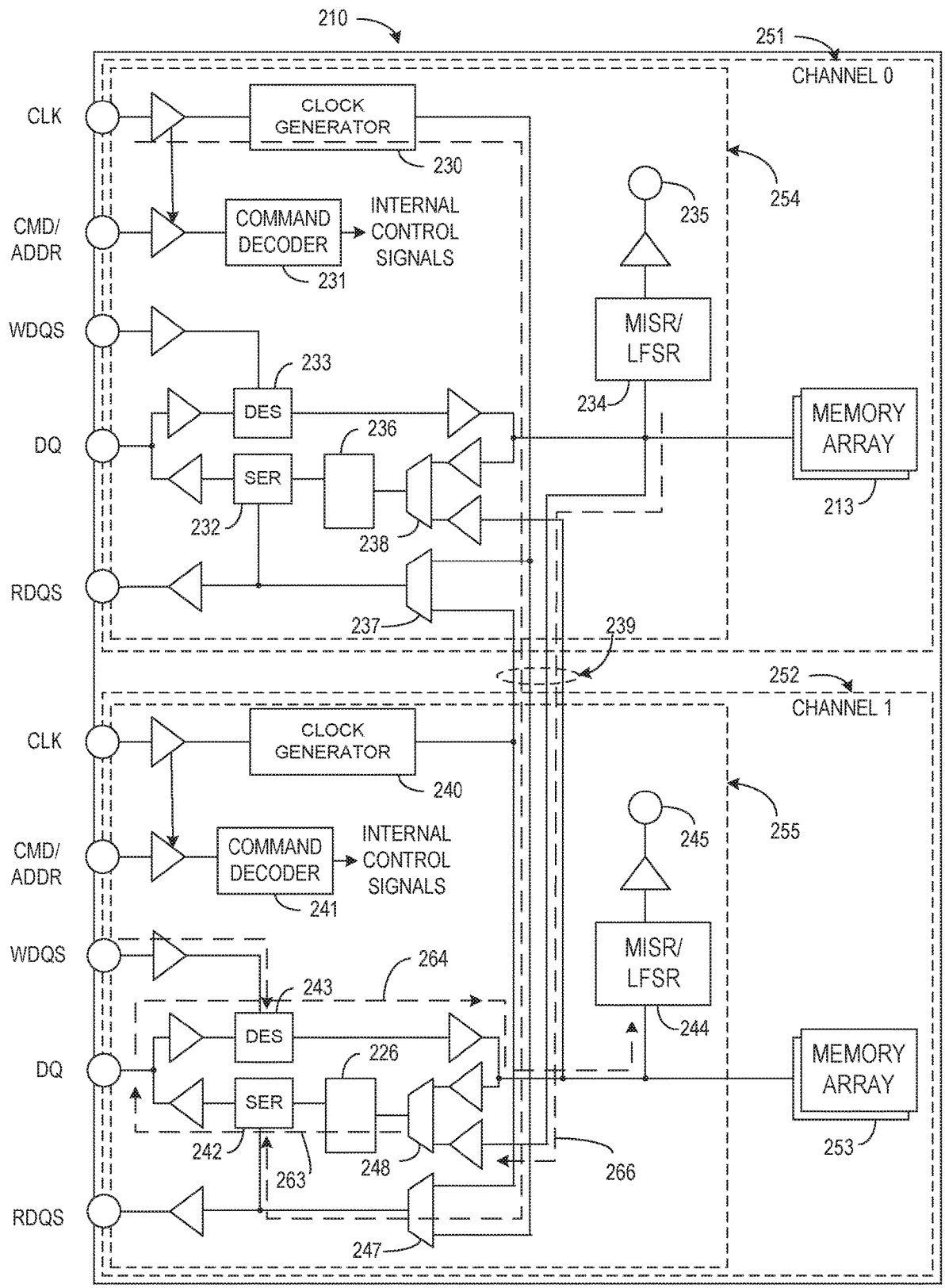

FIGS. 2A-2C illustrate generally example I/O logic circuits for two channels 251, 252 of a multi-channel, single-semiconductor memory chip 210 that allows execution of loop-back testing of the I/O logic circuit 254, 255 of each channel without requiring off-chip data paths such as the data paths discussed above with respect to FIG. 1. In certain examples, the I/O logic circuit 254, 255 of each channel 251, 252 can include external connections associated with micro-bumps, bonding pads, pins, terminals or the like such as a clock terminal (CLK), one or more command and address terminals (CMD/ADDR), a write data strobe input (WDQS), a read data strobe output (RDQS), and one or more data terminals (DQ). The I/O logic circuit 254, 255 of each channel 251, 252 can further include an optional clock generator 230, 240, a command decoder 231, 241, data serializer 232, 242, data de-serializer 233, 243, a controller (not shown), and a number of buffers (Δ). Each logic circuit can be coupled to a memory array 213, 253. Unlike conventional I/O logic circuits for multiple channel memory systems, the example I/O logic circuits 254, 255 can each include a multi-function register system 234, 244, one or more serial out terminals 235, 245, a read first-in, first-out buffer 236, 246, a read data strobe multiplexer 237, 247, a read data multiplexer 238, 248, and additional channel interconnections 239 that allow for loop-back test of the logic circuit 254, 255 for each channel 251, 252. In certain examples, a memory interface circuit 212 can include the I/O logic circuits 254, 255.

In certain examples, the multi-function register system 234, 244 of each channel 251, 252 can be coupled to the data bus of the corresponding memory array 213, 253 of the channel. In some examples, the multi-function register system 234, 244 can include a linear feedback shift register (LFSR), a multiple input signature register (MISR), or combination thereof.

In general, channel 0 can include a first data path 261 for moving information via a data signal, for example, from an internal circuit, such as the multi-function register system 234 or the memory array 213, to the data terminals (DQ) of Channel 0, and a second data path 262 for moving information via a data signal, for example, from the data terminals (DQ) to the internal circuit. The second data path 262 can be used, for example, to move information to a memory array 213 of channel 0 as the data bus of the memory array 213 can form part of the internal circuit in certain examples. Such an operation can be part of a write operation to the channel 0 memory array 213. The first data path 261 can be used, for example, to read information from the memory array 213 of channel 0.

Similarly, channel 1 can include a third data path 263 for moving information via a data signal, for example, to the data terminals of channel 1 from the internal circuit of channel 1 and a fourth data path 264 for moving information to the internal circuit of channel 1 from the data terminals of channel 1. The third data path 263 can be used, for example, to read information from a memory array 253 of channel 1 as the data bus of the memory array 253 can form a part of the internal circuit of channel 1 in certain examples. The fourth data path 264 can be used, for example, to write information to the memory array 253 of channel 1.

FIG. 2B illustrates generally example I/O logic circuits 254, 255 for two channels 251, 252 of a multi-channel, single-semiconductor memory chip 210 and data paths 261-264 used to pass or convey data between the data terminals and the internal circuit of each channel 251, 252, as well as, test data between the two channels during a loop-back test of the I/O logic circuit of a first channel, in this example, channel 0 (251). During the loop-back test of channel 0 (251), a first additional data path 265 can be enabled to move information between the first data path 261 and the internal circuit of channel 1. In certain examples, during a loop-back test of channel 0, the internal circuit of channel 1 can generate test information and can use a signal and the first additional data path 265 to move the test information from the internal circuit of channel 1 to the data terminals (DQ) of channel 0 via, also, the first data path 261. In addition, the second data path 262 can move the test information from the data terminals (DQ) of channel 0 to the internal circuit of channel 0. During the loop-back test of channel 0, the register 244 of the internal circuit of channel 1 can include a LFSR to generate the test information and the register 234 of channel 0 can include a MISR to receive the test data. In certain examples, the first additional data path 265 can be formed or activated using one or more of the additional channel interconnections 239 and selecting the proper path of the read data multiplexer 238 of channel 0 (251). In certain examples, the test information generated by the LFSR and the test information received at the MISR can be supplied to external test equipment for comparison and analysis. In certain examples, a serial test output 235, 245 of each I/O logic circuit 254, 255 can be used to supply the corresponding test information to the external test equipment. In some examples, the serial test outputs 235, 245 can provide the test information according to a standard, such as JTAG or IEEE Std. 1500 (P1500).

In certain examples, a clock signal from channel 1 (252) can be multiplexed to be applied on not only the read data strobe output (RDQS) of channel 1, but also the read data strobe output (RDQS) of channel 0. Such a clock path can be formed by selecting the appropriate path through each read data strobe multiplexer 237, 247. Such a clock signal can pace the movement of information during the loopback test of channel 0.

In summary, for certain examples, flow of test data for a loop back test of the I/O logic circuit 254 of channel 0 (251) can begin at the register 244 of channel 1 (252) and progress through the following elements and paths: additional data path 265 from channel 1 to channel 0, data path 261 via serializer 232, data terminals (DQ) of channel 0, data path 262 via the deserializer 233 and register 234 of channel 0. In addition, a clock signal from channel 1 can flow via an additional clock path of the additional channel interconnections 239 to pace the serializer 232 of channel 0. A clock signal received at the write data strobe input (WDQS) of channel 0 can pace the deserializer 233 of channel 0.

FIG. 2C illustrates generally example I/O logic circuits 254, 255 for two channels 251, 252 of a multi-channel, single-semiconductor memory chip 210 and data paths 261-264 used to pass data between the data terminals and the internal circuit of each channel 251, 252, as well as, test data between the two channels during a loop-back test of the I/O logic circuit of a first channel, in this example, channel 1 (252). During the loop-back test of channel 1 (252), a second additional data path 266 can be enabled to move information between the internal circuit of channel 0 and the internal circuit of channel 1. In certain examples, during a loop-back test of channel 1, the internal circuit of channel 0 can generate test information and can use a signal and the second additional data path 266 to move the test information from the internal circuit of channel 0 to the data terminals (DQ) of channel 1 via, also, the third data path 263. In addition, the fourth data path 264 can move the test information from the data terminals (DQ) of channel 1 to the internal circuit of channel 1. During the loop-back test of channel 1, the register 234 of the internal circuit of channel 0 can include a LFSR to generate the test information and the register 244 of channel 1 can include a MISR to receive the test data. In certain examples, the second additional data path 266 can be formed or activated using one or more of the additional channel interconnections 239 and selecting the proper path of the read data multiplexer 248 of channel 1 (252). In certain examples, the test information generated by the LFSR and the test information received at the MISR can be supplied to external test equipment for comparison and analysis. In certain examples, a serial test output 235, 245 of each I/O logic circuit 254, 255 can be used to supply the corresponding test information to the external test equipment. In some examples, the serial test outputs 235, 245 can provide the test information according to a standard, such as JTAG or IEEE Std. 1500 (P1500).

In certain examples, a clock signal from channel 0 (251) can be multiplexed to be applied on not only the read data strobe output (RDQS) of channel 0, but also the read data strobe output (RDQS) of channel 1. Such a clock path can be formed by selecting the appropriate path through each read data strobe multiplexer 237, 247. Such a signal can pace the movement of information during the loopback test of channel 1.

In summary, for certain examples, flow of test data for a loop back test of the I/O logic circuit 255 of channel 1 (252) can begin at the register 234 of channel 0 (251) and progress through the following elements and paths: additional data path 266 from channel 0 to channel 1, data path 263 via serializer 242, data terminals (DQ) of channel 1, data path 264 via the deserializer 243 and register 244 of channel 1. In addition, a clock signal from channel 0 can flow via an additional clock path of the additional channel interconnections 239 to pace the serializer 242 of channel 1. A clock signal received at the write data strobe input (WDQS) of channel 1 can pace the deserializer 243 of channel 1.

In certain examples, and as can be observed in the examples of FIGS. 2B and 2C, loop back tests of the I/O circuits of a multi-channel, single-semiconductor memory chip 210 can be accomplished without a data loopback path external to the multi-channel, single-semiconductor memory chip 210. In addition, the added traces and logic circuits to provide the additional data paths 265, 266 can be incorporated, for example, in the memory interface circuit 212 of the multi-channel, single-semiconductor memory chip 210, with little or no physical expansion of the memory subsystem 210.

In certain examples, during non-test modes, the read data multiplexers 238, 248 can isolate the additional data paths 265, 266 from exchanging data between channel 0 and channel 1. During test mode, the read data multiplexers 238 of channel 0 can isolate the memory array of the channel 1 from the third data path 63, and the read data multiplexers 248 of channel 1 can isolate the memory array of the channel 0 from the first data path 261.

Figure 3:
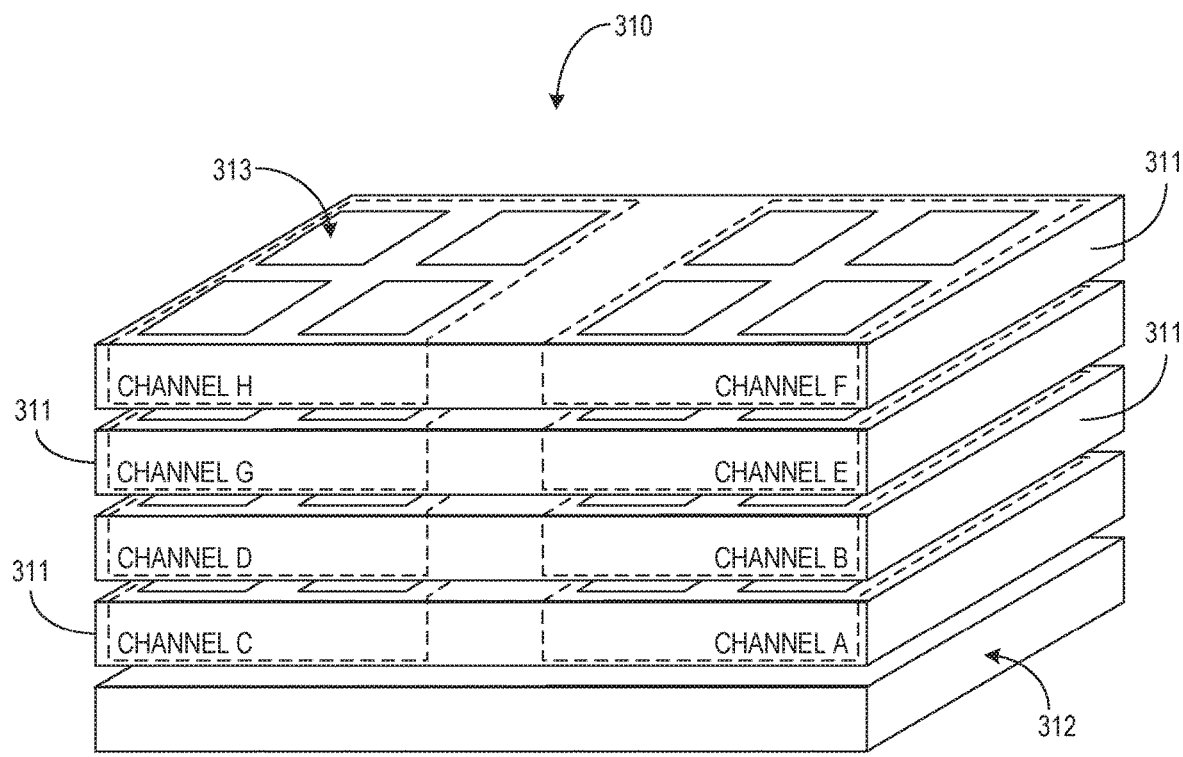
FIG. 3 illustrates generally an example memory subsystem that can be shipped to a vendor for integration into a memory system.

FIG. 3 illustrates generally an example memory subsystem 310 that can be shipped to a vendor for integration into a memory system. The memory subsystem 310 can include a stack of memory circuits 311, or memory dies, and a memory interface circuit 312. In certain examples, each memory circuit/die 311 can include a multiple memory arrays 313. One or more memory arrays 313 can be associated with respective channels (Channels A-H) of the memory subsystem 310. In certain examples, the memory sub-system can include high bandwidth memory (HBM) (which may be of many forms, with the Hybrid Memory Cube available from Micron Technology, Inc, and in accordance with one or more specifications from the Hybrid Memory Cube Consortium), wide I/O (WIO) memory, or high-speed memory such as double data rate type five synchronous graphics random access memory (GDDR5X). Such technologies can include or can be used to provide multiple channel memory circuits. In certain examples, multiple channel memory, circuits can use each channel independently of the others and can result in large increases in memory bandwidth compared to single channel memory circuits. The illustrated memory subsystem 310 includes eight channels (Channels A-H) that can operate independently to access the memory arrays 313. In some examples, memory interface circuit 312 includes logic functionality facilitating control and/or management of the memory circuits 311 stacked thereon. For example, in non-test modes, the memory interface circuit 312 can provide interface circuitry to receive control information from a memory controller and move non-test information between the memory arrays 313 and external circuits using the independent channels (Channels A-H). As described herein, memory interface circuit 312 can also be structured to enable test mode operations of the memory interface circuit 313, as discussed below.

Figure 4:
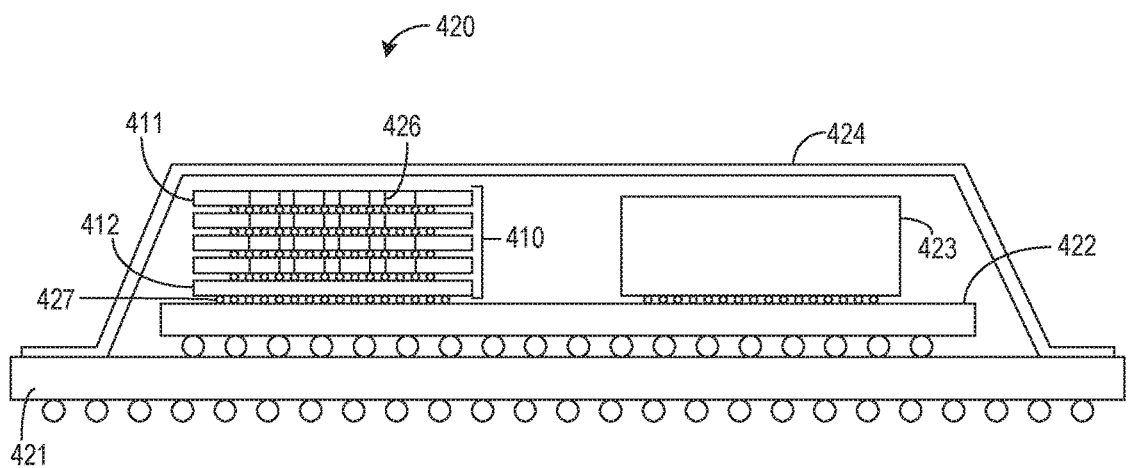
FIG. 4 illustrates generally an example memory package.

FIG. 4 illustrates generally an example memory package 420. In certain examples, the memory package can include a package substrate 421, an interposer 422, a memory controller 423, a memory subsystem 410 and a housing 424. The package substrate 421 can provide a base structure upon which the other components of the memory package 420 can be mounted. The package substrate 421 can also provide electrical connections to external components. The interposer 422 can provide external signal routing between the package substrate 421 and each of the memory subsystem 410 and the memory controller 423. The interposer 422 can also provide internal signal routing between the memory controller 423 and the memory subsystem 410. The housing 424 can protect the components of the memory package 420. The memory subsystem 410 can include a stack of memory circuits 411 and a memory interface circuit 412. In certain examples, signals can be passed between the stacked circuits using through silicon (or substrate) vias 426 (TSV) or connection pins. Each circuit can be electrically and mechanically mounted to an adjacent circuit or the interposer 422 using micro-bumps 427.

A vendor receiving the memory subsystem 410 can integrate the memory subsystem 410 into a memory package 420 that can include the memory controller 423, the interposer 422, the package substrate 421 and the housing 424. In certain examples, the memory interface circuit of the memory subsystem 410 can include a number of micro-bumps 427 for interfacing with the interposer 420. In an example, the micro-bumps 427 of a channel can be assigned for data (128), column command/address (8), row command/address (8), data bus inversion (16), data mask/error check (16), strobes (16), clock (2), and clock enable (1). For an 8-channel memory subsystem, the memory interface circuit 412 can include 1280 or more micro-bumps 427. It can be difficult and expensive to interface with the I/O circuits of the memory subsystem 410 for test mode purposes because of the size and density of the micro-bumps 427. It is understood that different numbers of micro-bumps per channel are possible with different implementations of multi-channel memory subsystems and that such subsystems are within the scope of the present subject matter.

The present subject matter provides apparatus and methods for implementing I/O circuit tests of the memory subsystem 410 without increasing the size of the memory subsystem 410 or relying on expensive test equipment to interface with the micro-bumps 427 of the memory interface circuit 412.

Figure 5A:
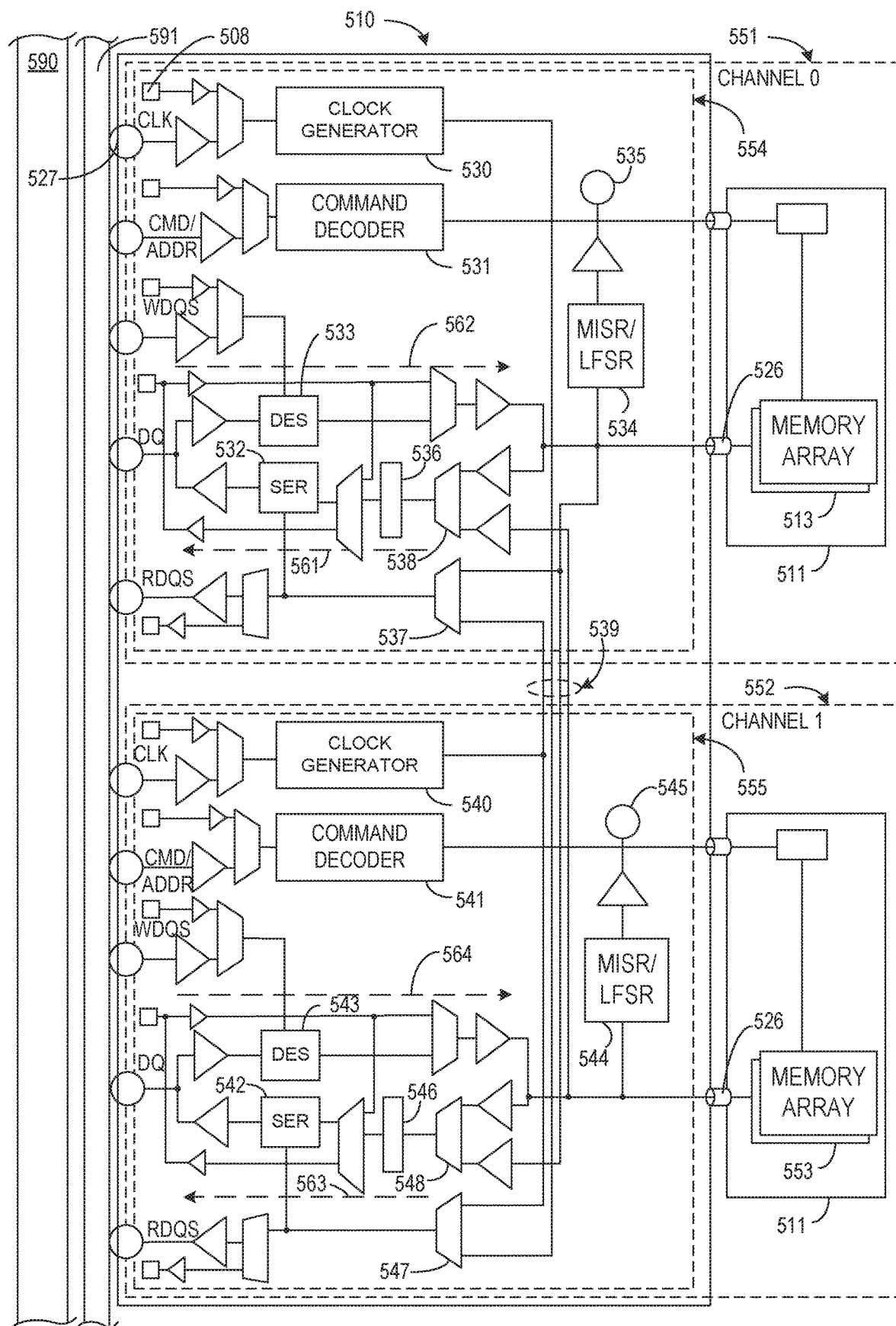
FIGS. 5A-5C illustrate generally example I/O logic circuits for two channels of a stacked, multi-channel memory subsystem that allows execution of loop-back testing of the I/O logic circuit of each channel without requiring off-circuit data paths.
Figure 5B:
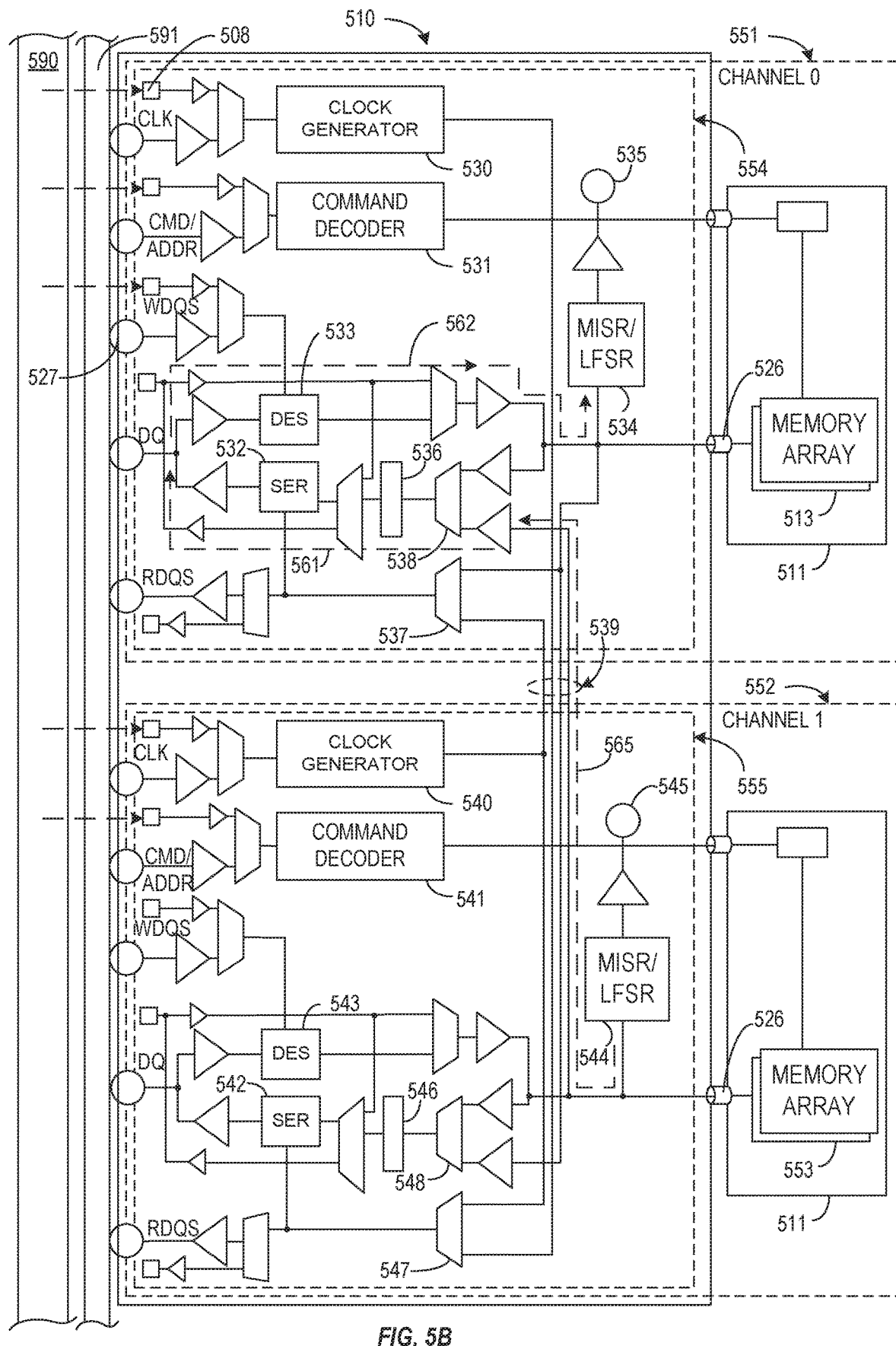
Figure 5C:
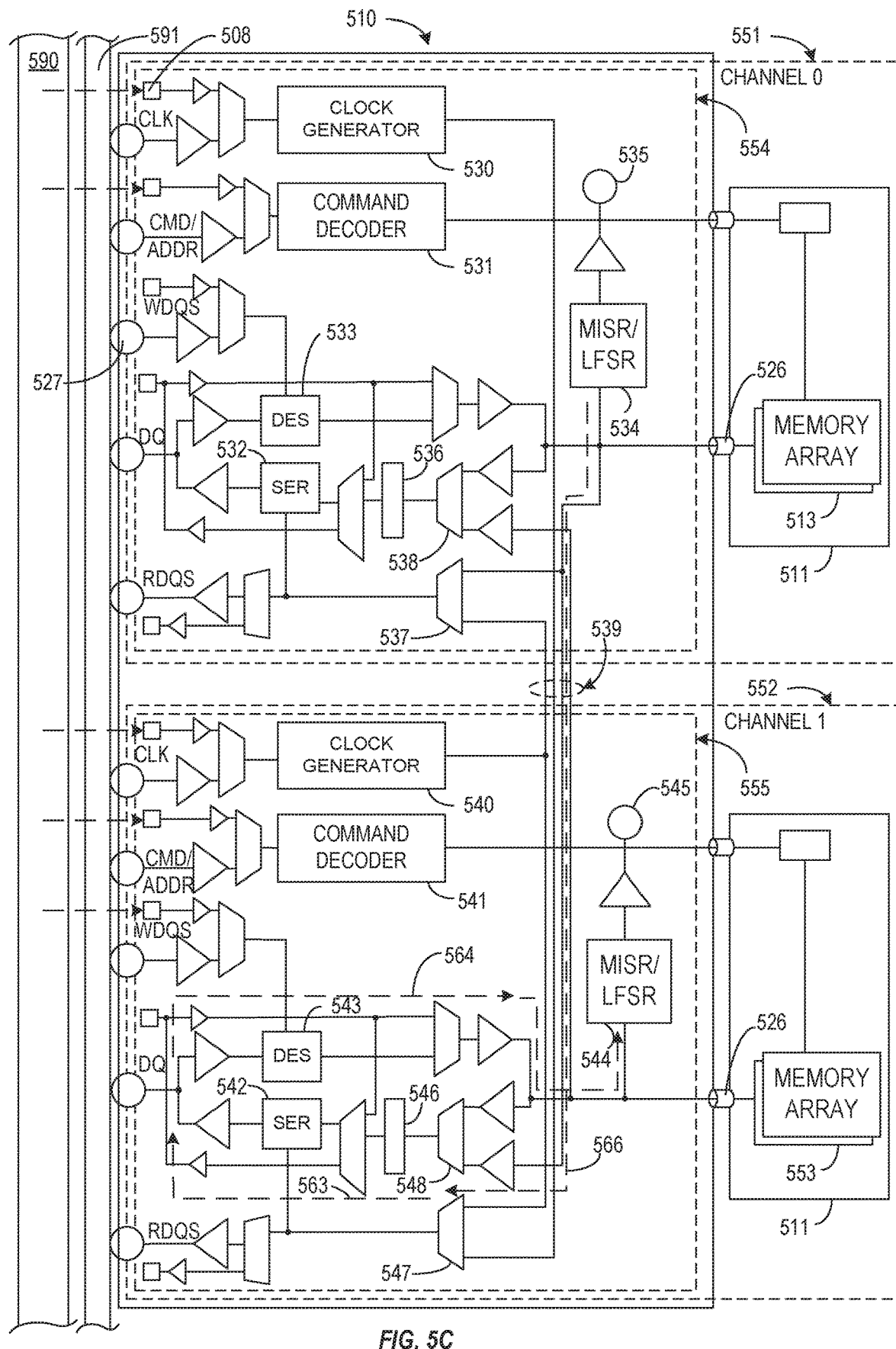

FIGS. 5A-5C illustrate generally example I/O logic circuits for two channels 551, 552 of a multi-channel memory subsystem 510 that allows execution of loop-back testing of the I/O logic circuit 554, 555 of each channel without requiring off-circuit data paths such as the data paths discussed above with respect to FIG. 1. In certain examples, the I/O logic circuit 554, 555 of each channel 551, 552 can include external connections associated with micro-bumps 527 (depicted as circles) or probe pads 508 (depicted as squares) such as a clock terminal (CLK), one or more command and address terminals (CMD/ADDR) a write data strobe input (WDQS), a read data strobe output (RDQS), and one or more data terminals (DQ). In certain examples, the probe pads 508 can be used by test equipment 590, via a substrate 591 on a test board to provide signals to the multi-channel memory subsystem 510. The I/O logic circuit 554, 555 of each channel 551, 552 can further include an optional clock generator 530, 540, a command decoder 531, 541, data serializer 532, 542, data de-serializer 533, 543, a controller (not shown), and a number of buffers (Δ). Each logic circuit can be coupled to a memory array 513, 553 of one or more memory devices 511. Unlike conventional I/O logic circuits for multiple channel memory systems, the example I/O logic circuits 554, 555 can each include a multi-function register system 534, 544, one or more serial out terminals 535, 545, a read first-in, first-out buffer 536, 546, a read data strobe multiplexer 537, 547, a read data multiplexer 538, 548, and additional channel interconnections 539 that allow for loop-back test of the logic circuit 554, 555 for each channel 551, 552. In certain examples, a memory interface circuit 512 can include the I/O logic circuits 554, 555. In certain examples, the memory arrays 513, 553 can be stacked with the memory interface circuit 512. In such examples, thru-silicon vias (TSVs) 526 can provide conductors for passing signals between the memory array 513, 553 and the I/O logic circuits 554, 555 of the memory interface circuit 512.

In certain examples, the multi-function register system 534, 544 of each channel 551, 552 can be coupled to the data bus of the corresponding memory array 513, 553 of the channel. In some examples, the multi-function register system 534, 544 can include a linear feedback shift register (LFSR), a multiple input signature register (MISR), or combination thereof.

In general, channel 0 can include a first data 561 path for moving information, via a data signal, for example, from an internal circuit, such as the multi-function register system 534 or the memory array 513, to the data terminals (DQ) of Channel 0, and a second data path 562 for moving information via a data signal, for example, from the data terminals (DQ) to the internal circuit. The second data path 562 can be used, for example, to move information to a memory array 513 of channel 0 as the data bus of the memory array 513 can form part of the internal circuit in certain examples. Such an operation can be part of a write operation to the channel 0 memory array 513. The first data path 561 can be used, for example, to read information from the memory array 513 of channel 0.

Similarly, channel 1 can include a third data path 563 for moving information via a data signal, for example, to the data terminals of channel 1 from the internal circuit of channel 1 and a fourth data path 564 for moving information to the internal circuit of channel 1 from the data terminals of channel 1. The third data path 563 can be used, for example, to read information from a memory array 553 of channel 1 as the data bus of the memory array 553 can form a part of the internal circuit of channel 1 in certain examples. The fourth data path 564 can be used, for example, to write information to the memory array 553 of channel 1.

FIG. 5B illustrates generally example logic circuits 554, 555 for two channels 551, 552 of a multi-channel subsystem 510 and data paths 561-564 used to pass data between the data terminals and the internal circuit of each channel 551, 552, as well as, test data between the two channels during a loop-back test of the logic circuit of a first channel, in this example, channel 1 (552). During the loop-back test of channel 1 (552), a second additional data path 566 can be enabled to move information between the internal circuit of channel 0 and the internal circuit of channel 1. In certain examples, during a loop-back test of channel 1, the internal circuit of channel 0 can generate test information and can use a signal and the second additional data path 366 to move the test information from the internal circuit of channel 0 to the data terminals (DQ) of channel 1 via, also, the third data path 563. In addition, the fourth data path 564 can move the test information from the data terminals (DQ) of channel 1 to the internal circuit of channel 1. During the loop-back test of channel 1, the register 534 of the internal circuit of channel 0 can include a LFSR to generate the test information and the register 544 of channel 1 include a MISR to receive the test data. In certain examples, the second additional data path 566 can be formed or activated using one or more of the additional channel interconnections 539 and selecting the proper path of the read data multiplexer 548 of channel 1 (552). In certain examples, the test information generated by the LFSR and the test information received at the MISR can be supplied to external test equipment for comparison and analysis. In certain examples, a serial test output 535, 545 of each I/O logic circuit 554, 555 can be used to supply the corresponding test information to the external test equipment. In some examples, the serial test outputs 535, 545 can provide the test information according to a standard, such as JTAG or IEEE Std. 1500 (P1500).

In certain examples, a clock signal from channel 0 (551) can be multiplexed to be applied on not only the read data strobe output (RDQS) of channel 0, but also the read data strobe output (RDQS) of channel 1. Such a clock path can be formed by selecting the appropriate path through each read data strobe multiplexer 537, 547. Such a signal can pace the movement of information during the loopback test of channel 1.

In summary, for certain examples, flow of test data for a loop back test of the I/O logic circuit 554 of channel 0 (551) can begin at the register 544 of channel 1 (552) and progress through the following elements and paths: additional data path 565 front channel 1 to channel 0, data path 561 via serializer 532, data terminals (DQ) of channel 0, data path 562 via the deserializer 533 of channel 0, and register 534 of channel 0. In addition, a clock signal from channel 1 can flow via an additional clock path of the additional channel interconnections 539 to pace the serializer 532 of channel 0. A clock signal received at the write data strobe input (WDQS) of channel 0 can pace the deserializer 533 of channel 0.

FIG. 5C illustrates generally example I/O logic circuits 554, 555 for two channels 551, 552 of a multi-channel subsystem 510 and data paths 561-564 used to pass or convey data between the data terminals and the internal circuit of each channel 551, 552, as well as, test data between the two channels during a loop-back test of the I/O logic circuit of a first channel, in this example, channel 0 (551). During the loop-back test of channel 0 (551), a first additional data path 565 can be enabled to move information between the first data path 561 and the internal circuit of channel 1. In certain examples, during a loop-back test of channel 0, the internal circuit of channel 1 can generate test information and can use a signal and the first additional data path 365 to move the test information from the internal circuit of channel 1 to the data terminals (DQ) of channel 0 via, also, the first data path 561. In addition, the second data path 562 can move the test information from the data terminals (DQ) of channel 0 to the internal circuit of channel 0. During the loop-back test of channel 0, the register 544 of the internal circuit of channel 1 can include a LFSR to generate the test information and the register 534 of channel 0 can include a MISR to receive the test data. In certain examples, the first additional data path 565 can be formed or activated using one or more of the additional channel interconnections 539 and selecting the proper path of the read data multiplexer 538 of channel 0 (551). In certain examples, the test information generated by the LFSR and the test information received at the MISR can be supplied to external test equipment for comparison and analysis. In certain examples, a serial test output 535, 545 of each I/O logic circuit 554, 555 can be used to supply the corresponding test information to the external test equipment. In some examples, the serial test outputs 535, 545 can provide the test information according to a standard, such as JTAG or IEEE Std. 1500 (P1500).

In certain examples, a clock signal from channel 1 (552) can be multiplexed to be applied on not only the read data strobe output (RDQS) of channel 1, but also the read data strobe output (RDQS) of channel 0. Such a clock path can be formed by selecting the appropriate path through each read data strobe multiplexer 537, 547. Such a clock signal can pace the movement of information during the loopback test of channel 0.

In summary, for certain examples, flow of test data for a loop back test of the I/O logic circuit 555 of channel 1 (552) can begin at the register 534 of channel 0 (551) and progress through the following elements and paths: additional data path. 566 from channel 0 to channel 1, data path 563 via serializer 542, data terminals (DQ) of channel 1, data path 564 via the deserializer 543 and register 544 of channel 1. In addition, a clock signal from channel 0 can flow via an additional clock path of the additional channel interconnections 539 to pace the serializer 542 of channel 1. A clock signal received at the write data strobe input (WDQS) of channel 1 can pace the deserializer 543 of channel 1.

In certain examples, and as can be observed in the examples of FIGS. 5B and 5C, loop back tests of the I/O circuits of a stacked memory subsystem 510 can be accomplished without a data loopback path external to the stacked memory subsystem 510. In addition, the added traces and logic circuits to provide the additional data paths 565, 566 can be incorporated, for example, in the memory interface circuit 512 of the memory subsystem 510, with little or no physical expansion of the memory subsystem 510.

In certain examples, during non-test modes, the read data multiplexers 538, 548 can isolate the additional data paths 565, 566 from exchanging data between channel 0 and channel 1. During test mode, the read data multiplexers 538 of channel 0 can isolate the memory array of the channel 1 from the third data path 563, and the read data multiplexers 548 of channel 1 can isolate the memory array of the channel 0 from the first data path 561.

Figure 6:
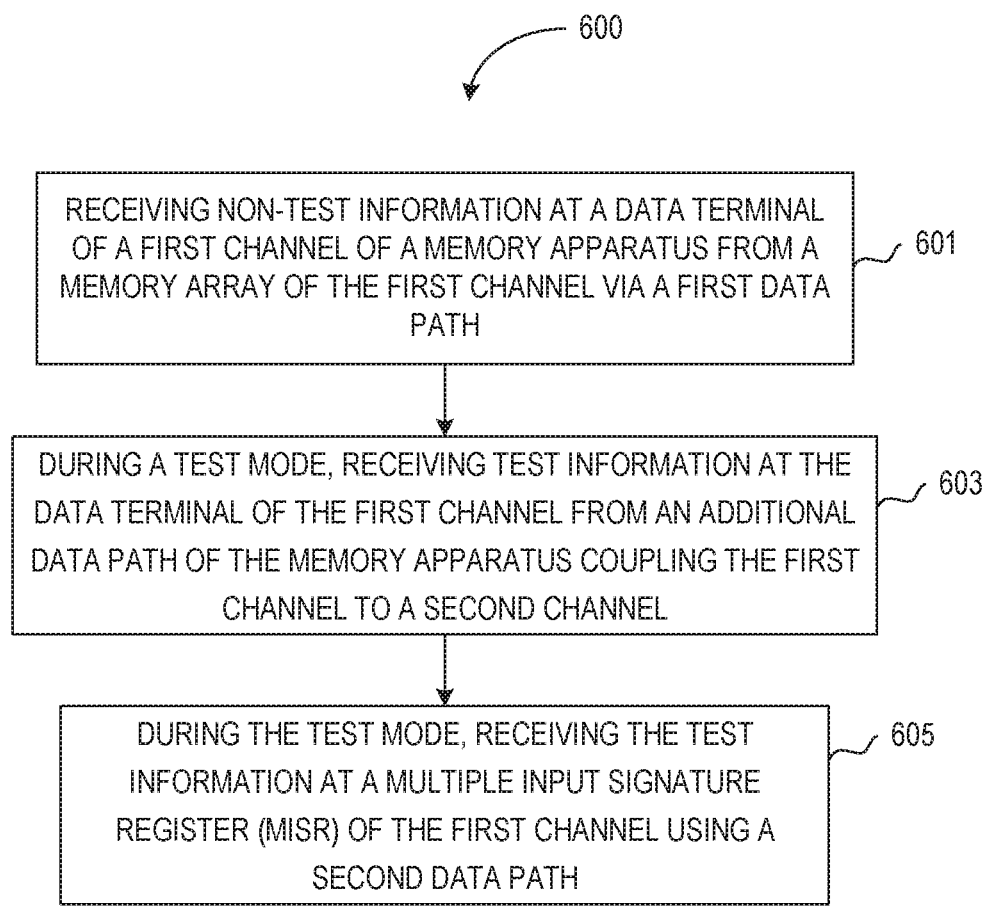
FIG. 6 illustrates generally a flowchart of an example method for operating a stacked memory sub-system while conducting an I/O loopback test.

FIG. 6 illustrates generally a flowchart of an example method 600 for operating a multiple channel memory circuit. The method 600 can include conducting an I/O loopback test. At 601, the memory apparatus can move non-test information between channel data terminals and channel memory arrays. In certain examples, non-test data can be stored on and retrieved from the memory arrays using data paths of eight independent channels of the memory apparatus. In certain examples, the memory apparatus can include a single semiconductor memory apparatus as discussed above with respect to FIGS. 2A-2C. In certain examples, the memory apparatus can include a stacked memory apparatus as discussed above with respect to FIGS. 3, 4 and 5A-5C. This step 601 may be optional and thus omitted, or may be executed after step 605.

At 603, during a test mode of the I/O circuits of a first channel, test information can be received at data terminals of the first channel from an additional data path that couples the first channel to another second channel. In certain examples, a read data multiplexer of the first channel can be used to route the data to the data terminals of the first channel via a first data path of the first channel and the first additional data path of the stacked memory apparatus. In certain examples, the additional data paths of the stacked memory apparatus can be coupled to a data bus of at least one of the channels of the memory apparatus. In some examples, the additional data paths can be physically implemented on a memory interface circuit of the stacked memory apparatus. In certain examples, the test data can be generated at the second channel using an LFSR.

At 605, the test data can be received at a register of the first channel from the data terminals of the first channel via a second data path of the first channel. In certain examples, the register can be a MISR. In certain examples, a read clock signal received from the second channel can be received at a read data strobe terminal of the first channel. The read clock signal can be used to pace the movement of the test data, for example, movement of the test data through a serializer of a data path of the first channel. In certain examples, a write clock signal can be received at a write data strobe terminal of the first channel during the test mode of the I/O circuits of the first channel. The write clock signal can be used pace the movement of the test data. For example, the write clock signal can pace movement of the test data from the data terminals of the first channel to the MISR via a de-serializer of a data path of the first channel.

In certain examples, a plurality of additional data paths of the stacked memory sub-system can couple pairs of channels to allow for I/O circuit testing of each channel without the need for an external test board to provide loopback testing paths for the test data. Providing the additional data paths within the stacked memory sub-system can eliminate the need for costly equipment while increasing I/O testing reliability for stacked memory sub-systems that include a significant number of micro-bump I/O connections.

Additional Notes

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or an are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

It will be understood that when an element is referred to as being "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine r computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed:

1. A memory apparatus, comprising:
multiple memory arrays defining multiple memory channels;
logic interface circuit coupled to the multiple memory arrays, the logic interface circuit having multiple data paths respectively associated with the multiple memory channels, wherein the logic interface circuit contains circuitry operable to perform test operations including communicating test data from a first memory channel to a second memory channel within the logic interface circuit;
wherein the first memory channel comprises:
a first internal circuit;
a first terminal;
a first data path between the first internal circuit and the first terminal to convey a first data signal from the first internal circuit to the first terminal; and
a second data path between the first internal circuit and the first terminal to convey a second data signal from the first terminal to the first internal circuit;
wherein the second memory channel comprises:
a second internal circuit;
a second terminal;
a third data path between the second internal circuit and the second terminal to convey a third data signal from the second internal circuit to the second terminal; and
a fourth data path between the second internal circuit and the second terminal to convey a fourth data signal from the second terminal to the second internal circuit; and
wherein the apparatus further comprises a first additional path between the first data path and the second internal circuit, the first additional path being configured, when activated, to convey a fifth data signal from the second internal circuit to the first terminal through the first additional path and the first data path.

2. The memory apparatus of claim 1, wherein each of the first and second memory channels comprises a respective I/O bus, and wherein the I/O buses of the first and second memory channels are configured to be in selective communication with one another.

3. The memory apparatus of claim 1, wherein the first memory channel includes a linear feedback shift register, the linear feedback shift register configured to generate the test data.

4. The memory apparatus of claim 1, wherein the second memory channel includes a multiple input signature shift register, the multiple input signature register configured to receive the test data.

5. The memory apparatus of claim 1, wherein a single semiconductor includes the multiple memory arrays and the logic interface circuit.

6. The memory apparatus of claim 1, wherein one or more first semiconductor dies include the multiple memory arrays;
   wherein a second semiconductor die includes the logic interface circuit; and
   wherein the one or more first semiconductor die and the second semiconductor die are arranged in a stack.

7. The memory apparatus of claim 1, wherein the first memory channel includes a first read data multiplexer configured to couple the first additional data path to the first data path during the first state of the test mode, and to isolate a memory array of the first memory channel from the first data path during the first state of the test mode.

8. The memory apparatus of claim 7, wherein the second memory channel includes a second read data multiplexer configured to couple the second additional data path to a third data path coupled to the second data terminal during the second state of the test mode, and to isolate a memory array of the second memory channel from the third data path during the second state of the test mode.

* * * * *